(12) United States Patent
Chung et al.

(10) Patent No.: US 9,018,662 B2
(45) Date of Patent: Apr. 28, 2015

(54) MULTICHIP PACKAGE STRUCTURE

(71) Applicant: Paragon Semiconductor Lighting Technology Co., Ltd., New Taipei (TW)

(72) Inventors: Chia-Tin Chung, Miaoli County (TW); Shih-Neng Tai, Taoyuan County (TW)

(73) Assignee: Paragon Semiconductor Lighting Technology Co., Ltd., New Taipe (TW)

( * ) Notice: Subject to any disclaimer, the term of this patent is extended or adjusted under 35 U.S.C. 154(b) by 0 days.

(21) Appl. No.: 14/076,489

(22) Filed: Nov. 11, 2013

(65) Prior Publication Data

US 2015/0061513 A1    Mar. 5, 2015

(30) Foreign Application Priority Data

Aug. 30, 2013  (TW) .............................. 102131265 A

(51) Int. Cl.
*H01L 33/50* (2010.01)
*H01L 25/075* (2006.01)
*H05B 33/08* (2006.01)

(52) U.S. Cl.
CPC ........ *H01L 25/0753* (2013.01); *H05B 33/0806* (2013.01)

(58) Field of Classification Search
USPC .......... 315/185 R, 291, 294, 312; 257/82, 84, 257/88–93, 98–100, 431, 433, 788
See application file for complete search history.

(56) References Cited

U.S. PATENT DOCUMENTS

| | | | | |
|---|---|---|---|---|
| 6,410,940 B1* | 6/2002 | Jiang et al. | ...................... | 257/82 |
| 6,498,355 B1* | 12/2002 | Harrah et al. | ................... | 257/99 |
| 6,661,030 B2* | 12/2003 | Komoto et al. | ................. | 257/98 |
| 8,217,404 B2* | 7/2012 | Wu et al. | .......................... | 257/88 |
| 8,791,471 B2* | 7/2014 | Leung | ............................. | 257/88 |
| 2011/0193109 A1* | 8/2011 | Loh | .................................. | 257/89 |
| 2012/0132938 A1* | 5/2012 | Komatsu et al. | ................ | 257/89 |

* cited by examiner

*Primary Examiner* — Tung X Le
(74) *Attorney, Agent, or Firm* — Li&Cai Intellectual Property (USA) Office

(57) ABSTRACT

A multichip package structure includes a metal substrate, a circuit substrate and a light-emitting module. The metal substrate has a first mirror plane area and a second mirror plane area. The circuit substrate is disposed on the metal substrate. The circuit substrate includes a plurality of first conductive pads, a plurality of second conductive pads, a first passing opening for exposing the first mirror plane area, and a second passing opening for exposing the second mirror plane area. The light-emitting module includes a plurality of light-emitting units disposed on the first mirror plane area. Each light-emitting unit includes a plurality of LED chips disposed on the first mirror plane area. The LED chips of each light-emitting unit are electrically connected between the first conductive pad and the second conductive pad in series. Thus, the heat-dissipating efficiency and the light-emitting effect of the multichip package structure can be increased.

13 Claims, 8 Drawing Sheets

MULTICHIP PACKAGE STRUCTURE

BACKGROUND OF THE INVENTION

1. Field of the Invention

The instant disclosure relates to a multichip package structure, and more particularly to a multichip package structure for increasing the heat-dissipating efficiency and the light-emitting effect.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices.

SUMMARY OF THE INVENTION

One aspect of the instant disclosure relates to a multichip package structure for increasing the heat-dissipating efficiency and the light-emitting effect.

One of the embodiments of the instant disclosure provides a multichip package structure, comprising: a metal substrate, a circuit substrate, a light-emitting module, a current-limiting module, a frame unit and package unit. The metal substrate has a first mirror plane area and a second mirror plane area, wherein the first mirror plane area and the second mirror plane area are disposed on the top surface of the metal substrate, and the first mirror plane area and the second mirror plane area are separated from each other by a predetermined distance. The circuit substrate is disposed on the metal substrate, wherein the circuit substrate includes a plurality of first conductive pads applied to the first mirror plane area, a plurality of second conductive pads applied to the first mirror plane area, a first passing opening for exposing the first mirror plane area, and a second passing opening for exposing the second mirror plane area. The light-emitting module includes a plurality of light-emitting units disposed on the first mirror plane area, wherein each light-emitting unit includes a plurality of LED chips disposed on the first mirror plane area, and the LED chips of each light-emitting unit are electrically connected between the corresponding first conductive pad and the corresponding second conductive pad in series. The current-limiting module includes a plurality of current-limiting chips disposed on the second mirror plane area and electrically connected to the light-emitting module. The frame unit includes a first surrounding gel frame and a second surrounding gel frame, wherein the first surrounding gel frame is surroundingly disposed on the circuit substrate by coating to form a first gel position limiting space, the second surrounding gel frame is surroundingly disposed on the circuit substrate by coating to form a second gel position limiting space, and the light-emitting module and the current-limiting module are respectively surrounded by the first surrounding gel frame and the second surrounding gel frame. The package unit includes a first package gel body and a second package gel body, wherein the first package gel body is received in the first gel position limiting space to enclose the light-emitting module, and the second package gel body is received in the second gel position limiting space to enclose the current-limiting module.

Another one of the embodiments of the instant disclosure provides a multichip package structure, comprising: a metal substrate, a circuit substrate, a light-emitting module, a current-limiting module, a frame unit and package unit. The metal substrate has an inner mirror plane area, an outer mirror plane area surrounding the inner mirror plane area, and a second mirror plane area, wherein the inner mirror plane area, the outer mirror plane area and the second mirror plane area are disposed on the top surface of the metal substrate, and the inner mirror plane area, the outer mirror plane area and the second mirror plane area are separated from each other by a predetermined distance. The circuit substrate is disposed on the metal substrate, wherein the circuit substrate includes a plurality of first inner conductive pads applied to the inner mirror plane area, a plurality of second inner conductive pads applied to the inner mirror plane area, a plurality of first outer conductive pads applied to the outer mirror plane area, a plurality of second outer conductive pads applied to the outer mirror plane area, an inner passing opening for exposing the inner mirror plane area, an outer passing opening for exposing the outer mirror plane area, and a second passing opening for exposing the second mirror plane area. The first light-emitting module includes a plurality of first light-emitting units disposed on the inner mirror plane area, wherein each first light-emitting unit includes a plurality of first LED chips disposed on the inner mirror plane area, and the first LED chips of each first light-emitting unit are electrically connected between the corresponding first inner conductive pad and the corresponding second inner conductive pad in series. The second light-emitting module includes a plurality of second light-emitting units disposed on the outer mirror plane area, wherein each second light-emitting unit includes a plurality of second LED chips disposed on the outer mirror plane area, and the second LED chips of each second light-emitting unit are electrically connected between the corresponding first outer conductive pad and the corresponding second outer conductive pad in series. The first current-limiting module includes a plurality of first current-limiting chips disposed on the second mirror plane area and electrically connected to the first light-emitting module. The second current-limiting module includes a plurality of second current-limiting chips disposed on the second mirror plane area and electrically connected to the second light-emitting module. The frame unit includes an inner surrounding gel frame, an outer surrounding gel frame and a second surrounding gel frame, wherein the inner surrounding gel frame is surroundingly disposed on the circuit substrate by coating and around the first light-emitting module to form an inner gel position limiting space, the outer surrounding gel frame is surroundingly disposed on the circuit substrate by coating and around the second light-emitting module and the inner surrounding gel frame to form an outer gel position limiting space between the inner surrounding gel frame and the outer surrounding gel frame, the second surrounding gel frame is surroundingly disposed on the circuit substrate by coating and around the first current-limiting module and the second current-limiting module to form a second gel position limiting space. The package unit includes an inner package gel body, an outer package gel body and a second package gel body, wherein the inner package gel body is received in the inner gel position limiting space to enclose the first light-emitting module, the outer package gel body is received in the outer gel position limiting space to enclose the second light-emitting module, and the second package gel body is received in the second gel position limiting space to enclose the first current-limiting module and the second current-limiting module.

Therefore, the metal substrate has a first mirror plane area for supporting the light-emitting module and the circuit substrate is disposed on the metal substrate for exposing the first mirror plane area, and the metal substrate has an inner mirror plane area for supporting the first light-emitting module and an outer mirror plane area for supporting the second light-emitting module and the circuit substrate is disposed on the metal substrate for exposing the inner mirror plane area and the outer mirror plane area, thus the heat-dissipating efficiency and the light-emitting effect of the multichip package structure can be increased.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
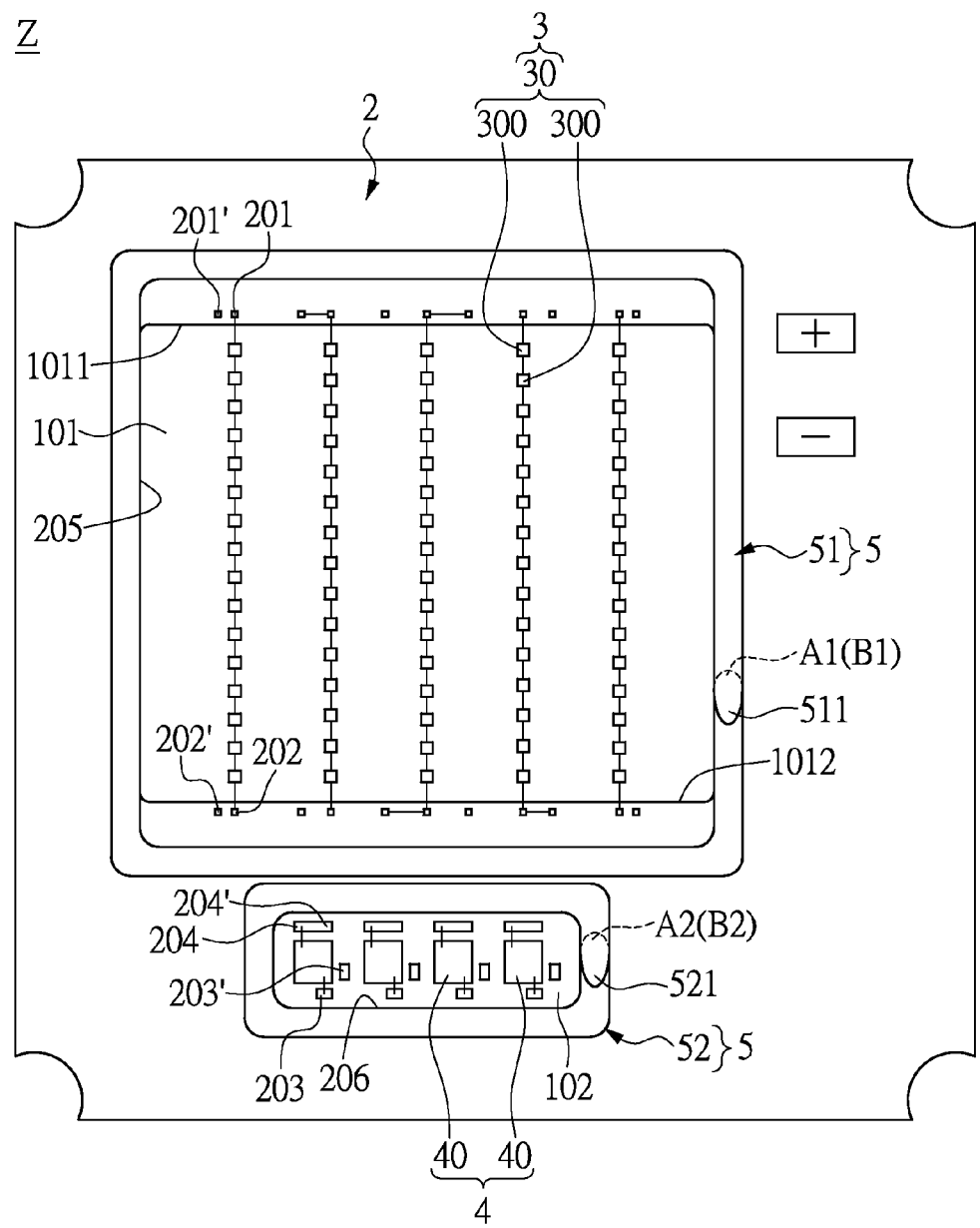
FIG. 1 shows a top, schematic view of the multichip package structure according to the first embodiment of the instant disclosure.

Referring to FIG. 1 to FIG. 4, where the first embodiment of the instant disclosure provides a multichip package structure Z for increasing the heat-dissipating efficiency and the light-emitting effect, comprising: a metal substrate 1, a circuit substrate 2, a light-emitting module 3, a current-limiting module 4, a frame unit 5 and package unit 6.

Figure 2:
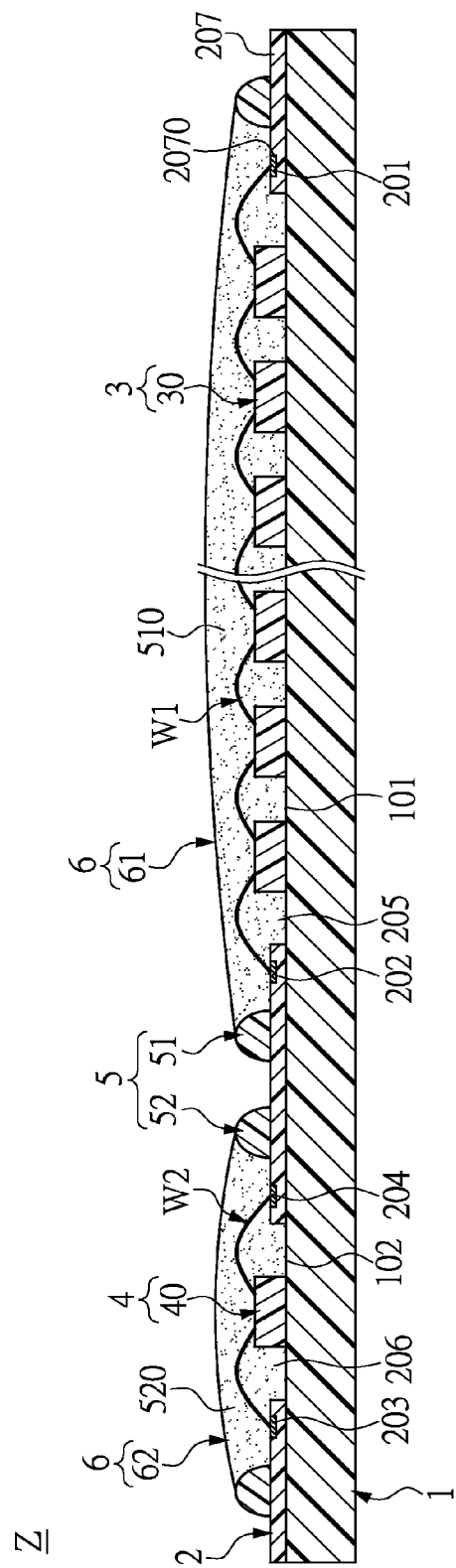
FIG. 2 shows a cross-sectional, schematic view of the multichip package structure according to the first embodiment of the instant disclosure.

First, referring to FIG. 1 and FIG. 2, the metal substrate 1 has a first mirror plane area 101 and a second mirror plane area 102. The first mirror plane area 101 and the second mirror plane area 102 are disposed on the top surface of the metal substrate 1, and the first mirror plane area 101 and the second mirror plane area 102 are separated from each other by a predetermined distance. For example, the metal substrate 1 may be a mirror aluminum substrate exhibiting a high reflection rate for increasing the heat-dissipating efficiency and the light-emitting effect.

Moreover, referring to FIG. 1 and FIG. 2, the circuit substrate 2 is disposed on the metal substrate 1. The circuit substrate 2 includes a plurality of first conductive pads 201 applied to the first mirror plane area 101, a plurality of second conductive pads 202 applied to the first mirror plane area 101, a plurality of third conductive pads 203 applied to the second mirror plane area 102 and a plurality of fourth conductive pads 204 applied to the second mirror plane area 102. The circuit substrate 2 further includes a first passing opening 205 for exposing the first mirror plane area 101 and a second passing opening 206 for exposing the second mirror plane area 102. In addition, the circuit substrate 2 includes a plurality of first standby (spare or backup) pads 201' respectively adjacent to the first conductive pads 201, a plurality of second standby pads 202' respectively adjacent to the second conductive pads 202, a plurality of third standby pads 203' respectively adjacent to the third conductive pads 203, and a plurality of fourth standby pads 204' respectively connected to the fourth conductive pads 204.

More precisely, referring to FIG. 1 and FIG. 2, the first mirror plane area 101 has a first lateral side 1011 and a second lateral side 1012 opposite to the first lateral side 1011, the first conductive pads 201 are arranged on the circuit substrate 2 along the first lateral side 1011 of the first mirror plane area 101, and the second conductive pads 202 are arranged on the circuit substrate 2 along the second lateral side 1012 of the first mirror plane area 101. In addition, referring to FIG. 2, the circuit substrate 2 includes an insulating protection layer 207 having a plurality of pad openings 2070, and the first, the second, the third and the fourth conductive pads (201, 202, 203 and 204) and the first, the second, the third and the fourth standby pads (201', 202', 203' and 204') are respectively exposed from the pad openings 2070 of the insulating protection layer 207.

Figure 3:
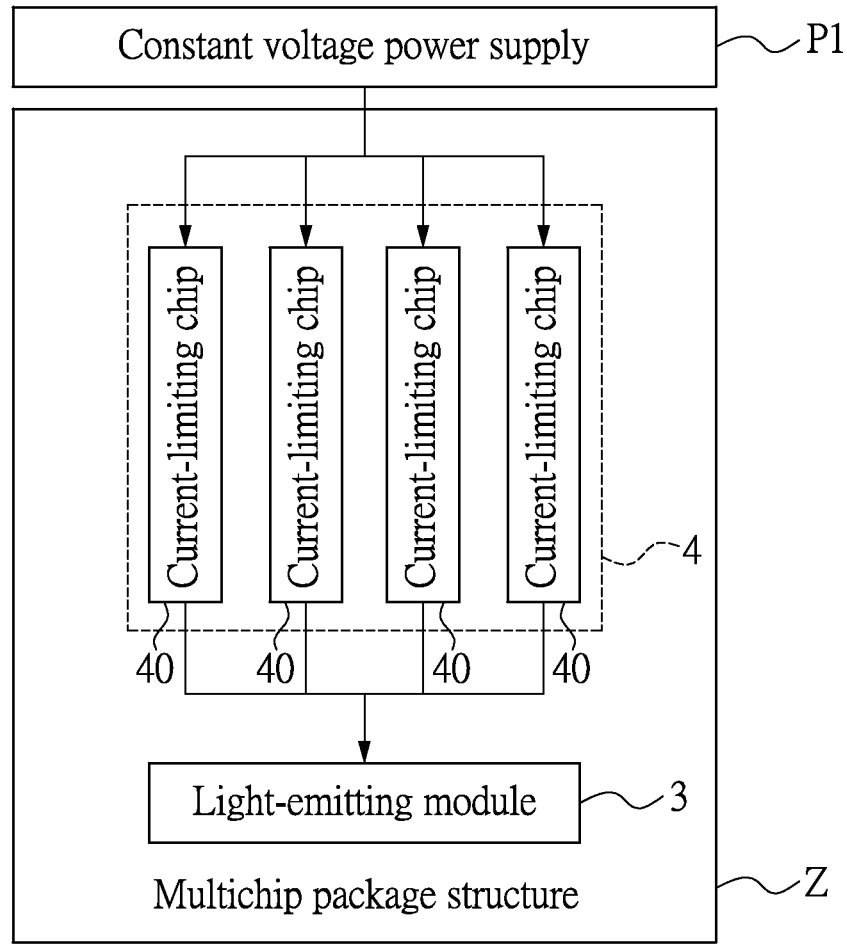
FIG. 3 shows a function block of the multichip package structure electrically connected to the constant voltage power supply according to the first embodiment of the instant disclosure.

Furthermore, referring to FIG. 1 to FIG. 3, the light-emitting module 3 includes a plurality of light-emitting units 30 disposed on the first mirror plane area 101. Each light-emitting unit 30 includes a plurality of LED chips 300 (such as LED dies that have not been packaged yet) disposed on the first mirror plane area 101, and the LED chips 300 of each light-emitting unit 30 are electrically connected between the corresponding first conductive pad 201 and the corresponding second conductive pad 202 in series. More precisely, referring to FIG. 2, the LED chips 300 of each light-emitting unit 30 can be electrically connected between "one of the first standby pad 201' and the first conductive pad 201" and "one of the second standby pad 202' and the second conductive pad 202" in series through a plurality of first conductive wires W1.

For example, any two of the first conductive pads 201 are adjacent to each other to form two first series connection pads, any two of the second conductive pads 202 are adjacent to each other to form two second series connection pads, any two of the first standby pads 201' are adjacent to each other to form two first parallel connection pads, and any two of the second standby pads 202' are adjacent to each other to form two second parallel connection pads. Hence, any two adjacent light-emitting units 30 can be electrically connected with each other in series through the two first series connection pads (such as the two adjacent first conductive pads 201) and the two second series connection pads (such as the two adjacent second conductive pads 202). Alternatively, any two adjacent light-emitting units 30 can be electrically connected with each other in parallel through the two first parallel connection pads (such as the two adjacent first standby pads 201') and the two second parallel connection pads (such as the two adjacent second standby pads 202').

For another example, any two of the first conductive pads 201 are adjacent to each other to form two first parallel connection pads, any two of the second conductive pads 202 are adjacent to each other to form two second parallel connection pads, any two of the first standby pads 201' are adjacent to each other to form two first series connection pads, and any two of the second standby pads 202' are adjacent to each other to form two second series connection pads. Hence, any two adjacent light-emitting units 30 can be electrically connected with each other in parallel through the two first parallel connection pads (such as the two adjacent first conductive pads 201) and the two second parallel connection pads (such as the two adjacent second conductive pads 202). Alternatively, any two adjacent light-emitting units 30 can be electrically connected with each other in series through the two first series connection pads (such as the two adjacent first standby pads 201') and the two second series connection pads (such as the two adjacent second standby pads 202').

Besides, referring to FIG. 1 to FIG. 3, the current-limiting module 4 includes a plurality of current-limiting chips 40 disposed on the second mirror plane area 102 and electrically connected to the light-emitting module 3. Each current-limiting chip 40 is electrically connected between the corresponding third conductive pad 203 and the corresponding fourth conductive pad 204, wherein the current-limiting chips 40 are electrically connected with each other in series. More precisely, referring to FIG. 2, each current-limiting chip 40 has a positive electrode electrically connected to one of the third conductive pad 203 and the third standby pad 203' through a second conductive wire W2, and each current-limiting chip 40 has a negative electrode electrically connected to one of the fourth conductive pad 204 and the fourth standby pad 204' through another second conductive wire W2. In addition, referring to FIG. 3, the current-limiting chips 40 such as electrical connection bridges can be electrically connected between light-emitting module 3 and the constant voltage power supply P1, thus the light-emitting module 3 can obtain constant voltage from the constant voltage power supply P1 through the current-limiting chips 40.

Moreover, referring to FIG. 1 and FIG. 2, the frame unit 5 includes a first surrounding gel frame 51 and a second surrounding gel frame 52. The first surrounding gel frame 51 is surroundingly disposed on the circuit substrate 2 by coating and disposed around the light-emitting module 3 to form a first gel position limiting space 510. The second surrounding gel frame 52 is surroundingly disposed on the circuit substrate 2 by coating and disposed around the current-limiting module 4 to form a second gel position limiting space 520. In addition, the package unit 6 includes a first package gel body 61 (such as a light-transmitting gel body) and a second package gel body 62 (such as an opaque gel body). The first package gel body 61 is received in the first gel position limiting space 510 to enclose the light-emitting module 3, and the second package gel body 62 is received in the second gel position limiting space 520 to enclose the current-limiting module 4. More precisely, referring to FIG. 1, the first surrounding gel frame 51 can be extended from a first initial point A1 to a first terminal point B1, and the position of the first initial point A1 and the position of the first terminal point B1 are substantially the same, thus two end portions of the first surrounding gel frame 51 are substantially overlapping to form a first convex junction portion 511 on the top side of the first surrounding gel frame 51. The second surrounding gel frame 52 can be extended from a second initial point A2 to a second terminal point B2, and the position of the second initial point A2 and the position of the second terminal point B2 are substantially the same, thus two end portions of the second surrounding gel frame 52 are substantially overlapping to form a second convex junction portion 521 on the top side of the second surrounding gel frame 52.

Figure 4:
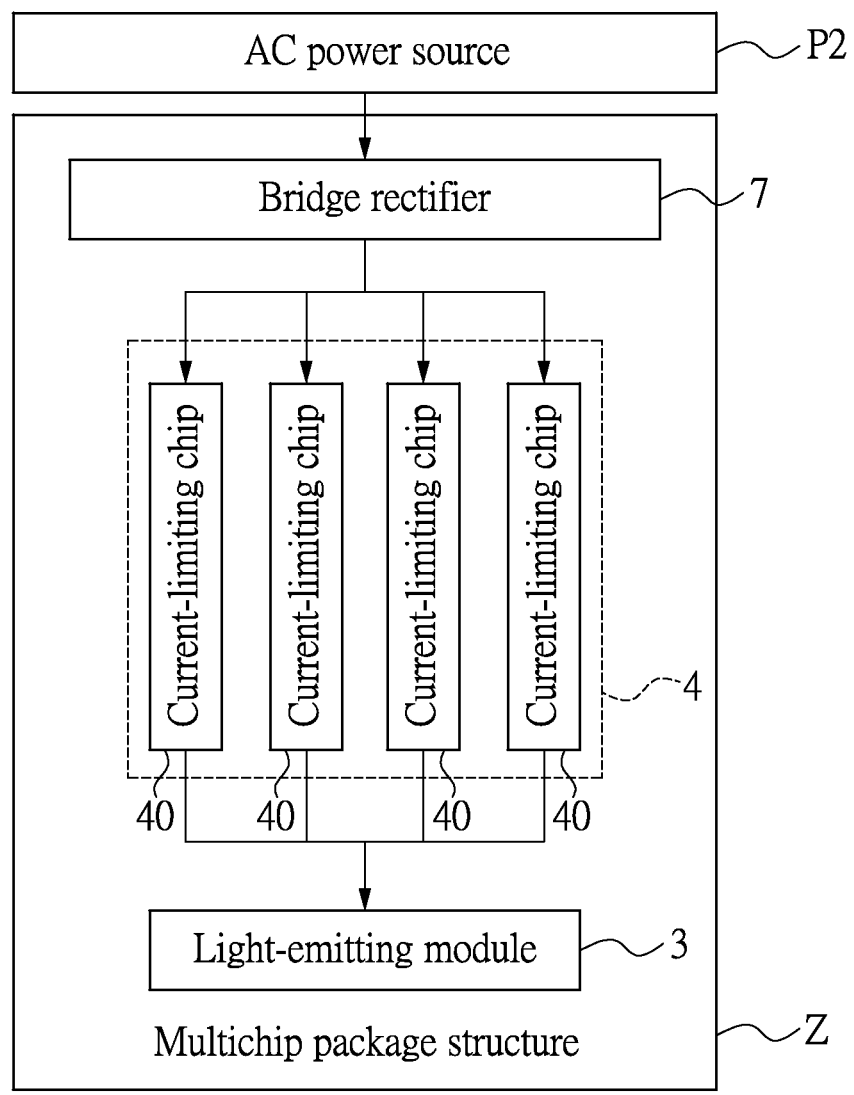
FIG. 4 shows a function block of the multichip package structure electrically connected to the AC power source according to the first embodiment of the instant disclosure.

Furthermore, referring to FIG. 4, the multichip package structure Z of the first embodiment of the instant disclosure further comprises: a bridge rectifier 7 disposed on the circuit substrate 2 and electrically connected between the current-limiting module 4 and an alternating current (AC) power source P2. The AC power source P2 can be transformed into a direct current (DC) power source through the bridge rectifier 7, thus the light-emitting module 3 can obtain constant voltage from the DC power source through the bridge rectifier 7 and the current-limiting module 4.

Second Embodiment

Referring to FIG. 5 to FIG. 8, where the second embodiment of the instant disclosure provides a multichip package structure Z for increasing the heat-dissipating efficiency and the light-emitting effect, comprising: a metal substrate 1, a circuit substrate 2, a first light-emitting module 3A, a second light-emitting module 3B, a first current-limiting module 4A, a second current-limiting module 4B, a frame unit 5 and package unit 6.

Figure 5:
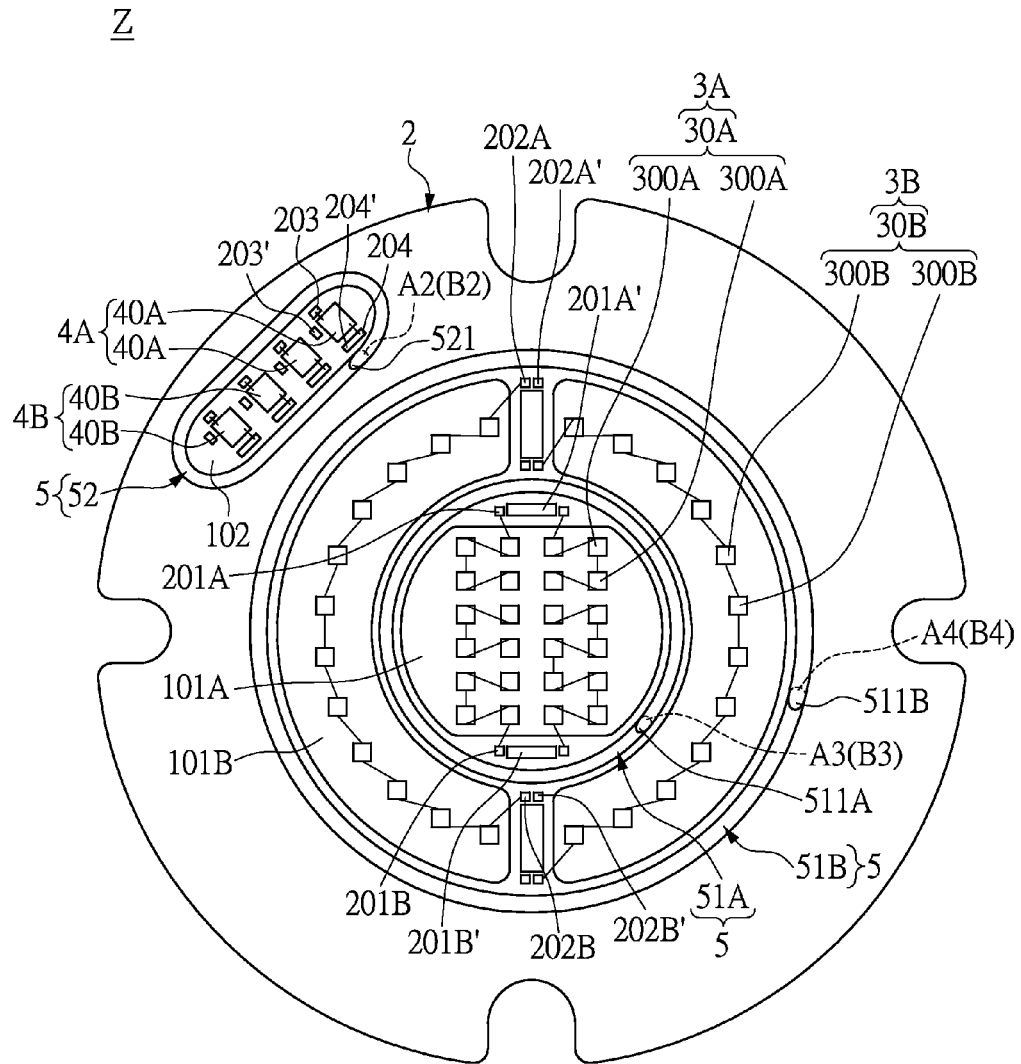
FIG. 5 shows a top, schematic view of the multichip package structure according to the second embodiment of the instant disclosure.
Figure 6:
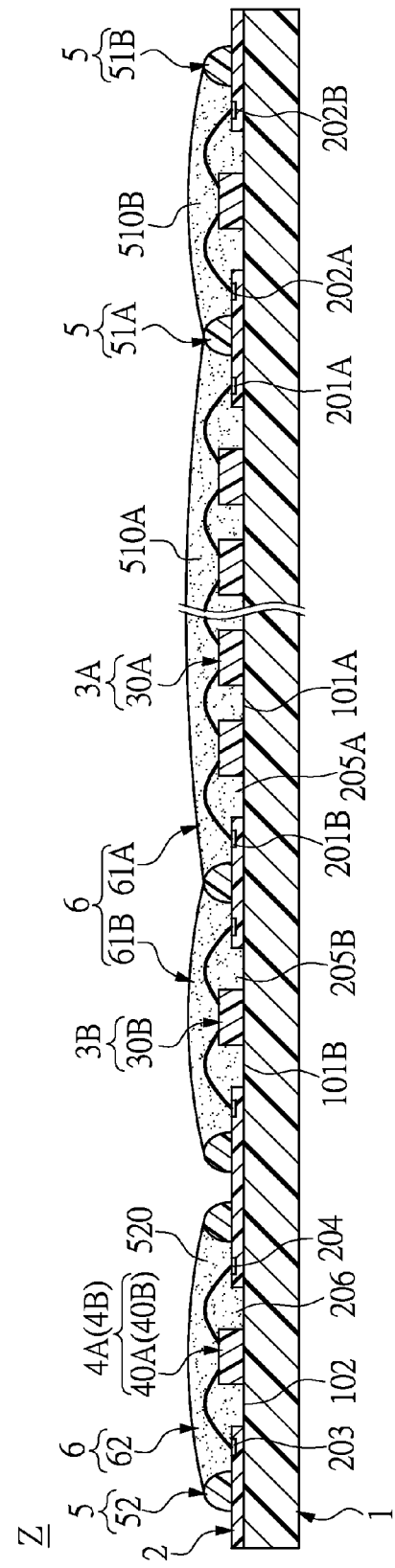
FIG. 6 shows a cross-sectional, schematic view of the multichip package structure according to the second embodiment of the instant disclosure.

First, referring to FIG. 5 and FIG. 6, the metal substrate 1 has an inner mirror plane area 101A, an outer mirror plane area 101B surrounding the inner mirror plane area 101A, and a second mirror plane area 102. The inner mirror plane area 101A, the outer mirror plane area 101B and the second mirror plane area 102 are disposed on the top surface of the metal substrate 1, and the inner mirror plane area 101A, the outer mirror plane area 101B and the second mirror plane area 102 are separated from each other by a predetermined distance. In addition, the circuit substrate 2 is disposed on the metal substrate 1. The circuit substrate 2 includes a plurality of first inner conductive pads 201A applied to the inner mirror plane area 101A, a plurality of second inner conductive pads 201B applied to the inner mirror plane area 101B, a plurality of first outer conductive pads 202A applied to the outer mirror plane area 101B, and a plurality of second outer conductive pads 202B applied to the outer mirror plane area 101B. The circuit substrate 2 further includes an inner passing opening 205A for exposing the inner mirror plane area 101A, an outer passing opening 205B for exposing the outer mirror plane area 101B, and a second passing opening 206 for exposing the second mirror plane area 102.

Figure 7:
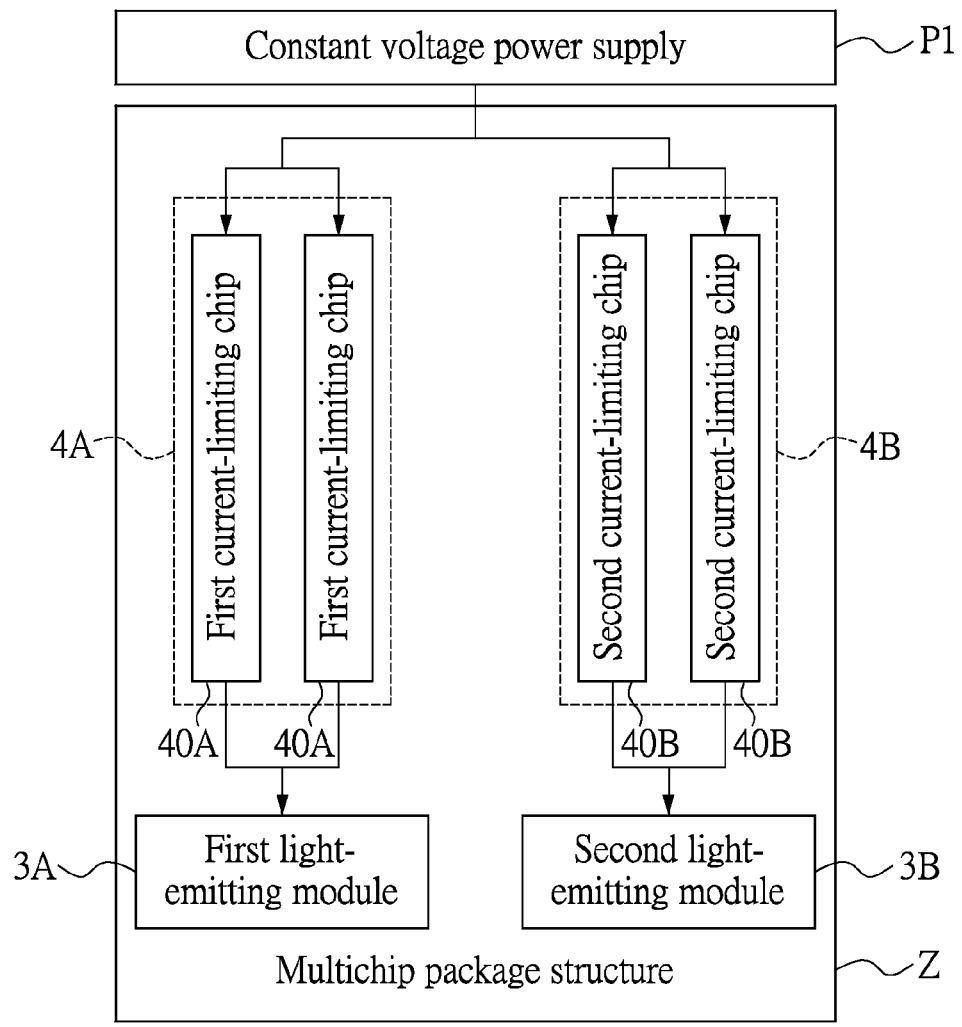
FIG. 7 shows a function block of the multichip package structure electrically connected to the constant voltage power supply according to the second embodiment of the instant disclosure.

Moreover, referring to FIG. 5 to FIG. 7, the first light-emitting module 3A includes a plurality of first light-emitting units 30A disposed on the inner mirror plane area 101A, where each first light-emitting unit 30A includes a plurality of first LED chips 300A disposed on the inner mirror plane area 101A, and the first LED chips 300A of each first light-emitting unit 30A are electrically connected between the corresponding first inner conductive pad 201A and the corresponding second inner conductive pad 201B in series. The second light-emitting module 3B including a plurality of second light-emitting units 30B disposed on the outer mirror plane area 101B, where each second light-emitting unit 30B includes a plurality of second LED chips 300B disposed on the outer mirror plane area 101B, and the second LED chips 300B of each second light-emitting unit 30B are electrically connected between the corresponding first outer conductive pad 202A and the corresponding second outer conductive pad 202B in series. In addition, the first current-limiting module 4A includes a plurality of first current-limiting chips 40A disposed on the second mirror plane area 102 and electrically connected to the first light-emitting module 3A, and the second current-limiting module 4B includes a plurality of second current-limiting chips 40B disposed on the second mirror plane area 102 and electrically connected to the second light-emitting module 3B.

Furthermore, referring to FIG. 5 and FIG. 6, the frame unit 5 includes an inner surrounding gel frame 51A, an outer surrounding gel frame 51B and a second surrounding gel frame 52. The inner surrounding gel frame 51A is surroundingly disposed on the circuit substrate 2 by coating and disposed around the first light-emitting module 3A to form an inner gel position limiting space 510A. The outer surrounding gel frame 51B is surroundingly disposed on the circuit substrate 2 by coating and disposed around the second light-emitting module 3B and the inner surrounding gel frame 51A to form an outer gel position limiting space 510B between the inner surrounding gel frame 51A and the outer surrounding gel frame 51B. The second surrounding gel frame 52 is surroundingly disposed on the circuit substrate 2 by coating and disposed around the first current-limiting module 4A and the second current-limiting module 4B to form a second gel position limiting space 520. In addition, the package unit 6 includes an inner package gel body 61A, an outer package gel body 61B and a second package gel body 62. The inner package gel body 61A is received in the inner gel position limiting space 510A to enclose the first light-emitting module 3A, the outer package gel body 61B is received in the outer gel position limiting space 510B to enclose the second light-emitting module 3B, and the second package gel body 62 is received in the second gel position limiting space 520 to enclose the first current-limiting module 4A and the second current-limiting module 4B.

More precisely, referring to FIG. 5 and FIG. 6, the first inner conductive pads 201A are arranged on the circuit substrate 2 along a lateral side of the inner mirror plane area 101A, the second inner conductive pads 201B are arranged on the circuit substrate 2 along another lateral side of the inner mirror plane area 101A, and the circuit substrate 2 further includes a plurality of first inner standby pads 201A' respectively adjacent to the first inner conductive pads 201A and a plurality of second inner standby pads 201B' respectively adjacent to the second inner conductive pads 201B. In addition, the first outer conductive pads 202A are arranged on the circuit substrate 2 along a lateral side of the outer mirror plane area 101B, the second outer conductive pads 202B are arranged on the circuit substrate 2 along another lateral side of the outer mirror plane area 101B, and the circuit substrate 2 further includes a plurality of first outer standby pads 202A' respectively adjacent to the first outer conductive pads 202A and a plurality of second outer standby pads 202B' respectively adjacent to the second outer conductive pads 202B. Furthermore, the circuit substrate 2 further includes a plurality of third conductive pads 203 corresponding to the first current-limiting chips 40A and the second current-limiting chips 40B and a plurality of fourth conductive pads 204 corresponding to the first current-limiting chips 40A and the second current-limiting chips 40B. Each first current-limiting chip 40A is electrically connected between the corresponding third conductive pad 203 and the corresponding fourth conductive pad 204, and each second current-limiting chip 40B is electrically connected between the corresponding third conductive pad 203 and the corresponding fourth conductive pad 204. In addition, the first current-limiting chips 40A are electrically connected with each other in series, the second current-limiting chips 40B are electrically connected with each other in series, and the circuit substrate 2 includes a plurality of third standby pads 203' respectively adjacent to the third conductive pads 203 and a plurality of fourth standby pads 204' respectively connected to the fourth conductive pads 204.

More precisely, referring to FIG. 5 and FIG. 6, the inner surrounding gel frame 51A is extended from an inner initial point A3 to an inner terminal point B3, and the position of the inner initial point A3 and the position of the inner terminal point B3 are substantially the same, thus two end portions of the inner surrounding gel frame 51A are substantially overlapping to form an inner convex junction portion 511A on the top side of the inner surrounding gel frame 51A. In addition, the outer surrounding gel frame 51B is extended from an outer initial point A4 to an outer terminal point B4, and the position of the outer initial point A4 and the position of the outer terminal point B4 are substantially the same, thus two end portions of the outer surrounding gel frame 51B are substantially overlapping to form an outer convex junction portion 511B on the top side of the outer surrounding gel frame 51B. Besides, the second surrounding gel frame 52 is extended from a second initial point A2 to a second terminal point B2, and the position of the second initial point A2 and the position of the second terminal point B2 are substantially the same, thus two end portions of the second surrounding gel frame 52 are substantially overlapping to form a second convex junction portion 521 on the top side of the second surrounding gel frame 52.

Figure 8:
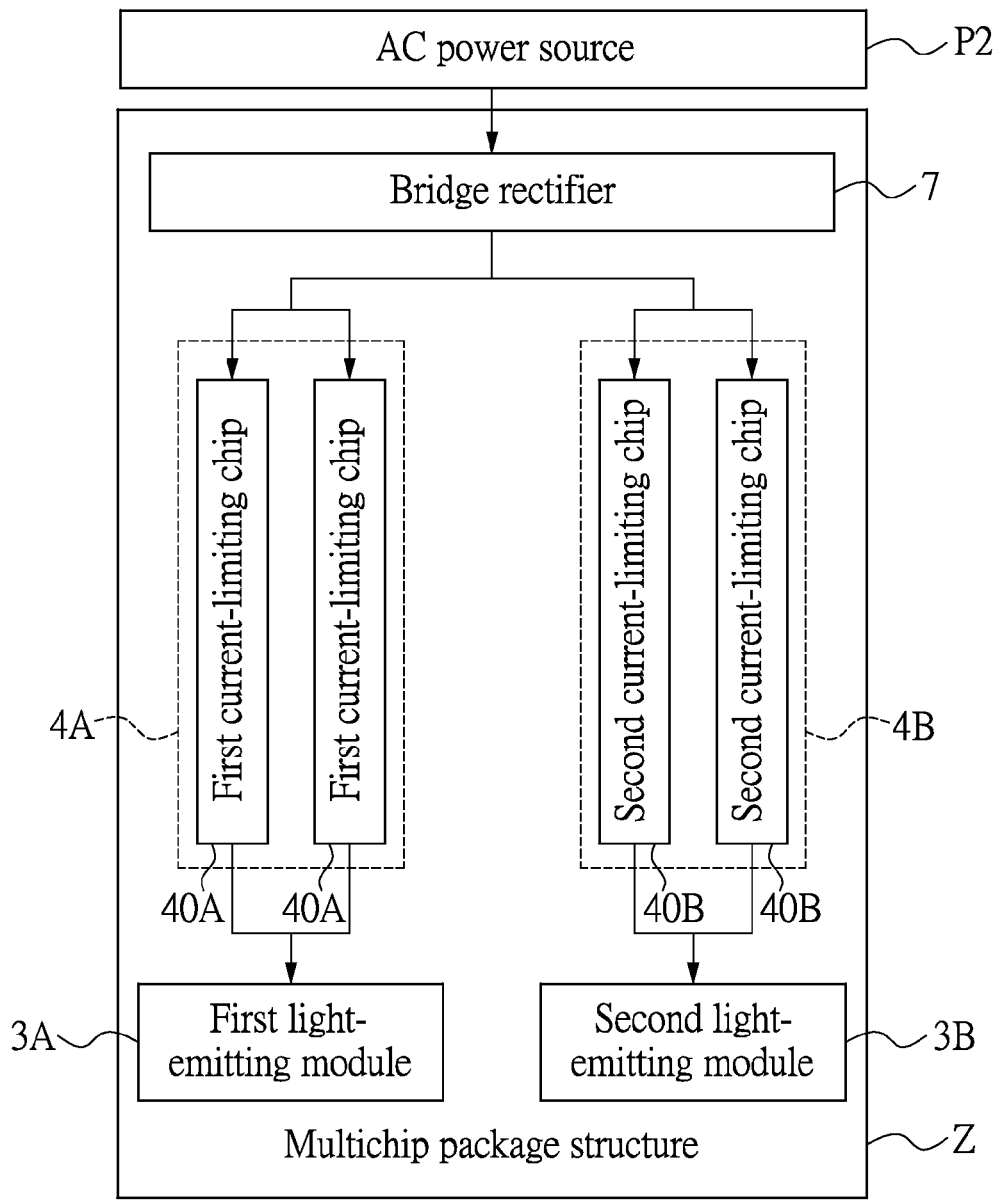
FIG. 8 shows a function block of the multichip package structure electrically connected to the AC power source according to the second embodiment of the instant disclosure.

Moreover, referring to FIG. 8, the multichip package structure Z of the second embodiment of the instant disclosure further comprises: a bridge rectifier 7 disposed on the circuit substrate 2 and electrically connected among the first current-limiting module 4A, the second current-limiting module 4B and an alternating current (AC) power source P2. The AC power source P2 can be transformed into a direct current (DC) power source through the bridge rectifier 7, thus the first light-emitting module 3A can obtain constant voltage from the DC power source through the bridge rectifier 7 and the first current-limiting module 4A in sequence, and the second light-emitting module 3B can obtain constant voltage from the DC power source through the bridge rectifier 7 and the second current-limiting module 4B in sequence.

In conclusion, the metal substrate 1 has a first mirror plane area 101 for supporting the light-emitting module 3 and the circuit substrate 2 is disposed on the metal substrate 1 for exposing the first mirror plane area 101 (as disclosed by the first embodiment), and the metal substrate 1 has an inner mirror plane area 101A for supporting the first light-emitting module 3A and an outer mirror plane area 101B for supporting the second light-emitting module 3B and the circuit substrate 2 is disposed on the metal substrate 1 for exposing the inner mirror plane area 101A and the outer mirror plane area 101B (as disclosed by the second embodiment), thus the heat-dissipating efficiency and the light-emitting effect of the multichip package structure Z can be increased.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A multichip package structure, comprising:
   a metal substrate having a first mirror plane area and a second mirror plane area, wherein the first mirror plane area and the second mirror plane area are disposed on the top surface of the metal substrate, and the first mirror plane area and the second mirror plane area are separated from each other by a predetermined distance;
   a circuit substrate disposed on the metal substrate, wherein the circuit substrate includes a plurality of first conductive pads applied to the first mirror plane area, a plurality of second conductive pads applied to the first mirror plane area, a first passing opening for exposing the first mirror plane area, and a second passing opening for exposing the second mirror plane area;
   a light-emitting module including a plurality of light-emitting units disposed on the first mirror plane area, wherein each light-emitting unit includes a plurality of LED chips disposed on the first mirror plane area, and the LED chips of each light-emitting unit are electrically connected between the first conductive pad and the second conductive pad in series;
   a current-limiting module including a plurality of current-limiting chips disposed on the second mirror plane area and electrically connected to the light-emitting module;
   a frame unit including a first surrounding gel frame and a second surrounding gel frame, wherein the first surrounding gel frame is surroundingly disposed on the circuit substrate by coating to form a first gel position limiting space, the second surrounding gel frame is surroundingly disposed on the circuit substrate by coating to form a second gel position limiting space, and the light-emitting module and the current-limiting module are respectively surrounded by the first surrounding gel frame and the second surrounding gel frame; and
   a package unit including a first package gel body and a second package gel body, wherein the first package gel body is received in the first gel position limiting space to enclose the light-emitting module, and the second package gel body is received in the second gel position limiting space to enclose the current-limiting module.

2. The multichip package structure of claim 1, wherein the first mirror plane area has a first lateral side and a second lateral side opposite to the first lateral side, the first conductive pads are arranged on the circuit substrate along the first lateral side of the first mirror plane area, the second conductive pads are arranged on the circuit substrate along the second lateral side of the first mirror plane area, and the circuit substrate includes a plurality of first standby pads respectively adjacent to the first conductive pads and a plurality of second standby pads respectively adjacent to the second conductive pads.

3. The multichip package structure of claim 2, wherein the circuit substrate includes a plurality of third conductive pads applied to the second mirror plane area and a plurality of fourth conductive pads applied to the second mirror plane area, and each current-limiting chip is electrically connected between the corresponding third conductive pad and the corresponding fourth conductive pad, wherein the current-limiting chips are electrically connected with each other in series, and the circuit substrate includes a plurality of third standby pads respectively adjacent to the third conductive pads and a plurality of fourth standby pads respectively connected to the fourth conductive pads.

4. The multichip package structure of claim 3, wherein the circuit substrate includes an insulating protection layer having a plurality of pad openings, and the first, the second, the third and the fourth conductive pads and the first, the second, the third and the fourth standby pads are respectively exposed from the pad openings of the insulating protection layer.

5. The multichip package structure of claim 2, wherein two of the first conductive pads are adjacent to each other to form two first series connection pads, two of the second conductive pads are adjacent to each other to form two second series connection pads, two of the first standby pads are adjacent to each other to form two first parallel connection pads, two of the second standby pads are adjacent to each other to form two second parallel connection pads, and two of the light-emitting units are adjacent to each other and electrically connected with each other in series through the two first series connection pads and the two second series connection pads.

6. The multichip package structure of claim 2, wherein two of the first conductive pads are adjacent to each other to form two first parallel connection pads, two of the second conductive pads are adjacent to each other to form two second parallel connection pads, two of the first standby pads are adjacent to each other to form two first series connection pads, two of the second standby pads are adjacent to each other to form two second series connection pads, and two of the light-emitting units are adjacent to each other and electrically connected with each other in parallel through the two first parallel connection pads and the two second parallel connection pads.

7. The multichip package structure of claim 1, wherein the first surrounding gel frame is extended from a first initial point to a first terminal point, and the position of the first initial point and the position of the first terminal point are substantially the same, thus two end portions of the first surrounding gel frame are substantially overlapping to form a first convex junction portion on the top side of the first surrounding gel frame, wherein the second surrounding gel frame is extended from a second initial point to a second terminal point, and the position of the second initial point and the position of the second terminal point are substantially the same, thus two end portions of the second surrounding gel frame are substantially overlapping to form a second convex junction portion on the top side of the second surrounding gel frame.

8. The multichip package structure of claim 1, further comprising: a bridge rectifier disposed on the circuit substrate and electrically connected between the current-limiting module and an alternating current power source.

9. A multichip package structure, comprising:
   a metal substrate having an inner mirror plane area, an outer mirror plane area surrounding the inner mirror plane area, and a second mirror plane area, wherein the inner mirror plane area, the outer mirror plane area and the second mirror plane area are disposed on the top surface of the metal substrate, and the inner mirror plane area, the outer mirror plane area and the second mirror plane area are separated from each other by a predetermined distance;
   a circuit substrate disposed on the metal substrate, wherein the circuit substrate includes a plurality of first inner conductive pads applied to the inner mirror plane area, a plurality of second inner conductive pads applied to the inner mirror plane area, a plurality of first outer conductive pads applied to the outer mirror plane area, a plurality of second outer conductive pads applied to the outer mirror plane area, an inner passing opening for exposing the inner mirror plane area, an outer passing opening for exposing the outer mirror plane area, and a second passing opening for exposing the second mirror plane area;

a first light-emitting module including a plurality of first light-emitting units disposed on the inner mirror plane area, wherein each first light-emitting unit includes a plurality of first LED chips disposed on the inner mirror plane area, and the first LED chips of each first light-emitting unit are electrically connected between the first inner conductive pad and the second inner conductive pad in series;

a second light-emitting module including a plurality of second light-emitting units disposed on the outer mirror plane area, wherein each second light-emitting unit includes a plurality of second LED chips disposed on the outer mirror plane area, and the second LED chips of each second light-emitting unit are electrically connected between the first outer conductive pad and the second outer conductive pad in series;

a first current-limiting module including a plurality of first current-limiting chips disposed on the second mirror plane area and electrically connected to the first light-emitting module;

a second current-limiting module including a plurality of second current-limiting chips disposed on the second mirror plane area and electrically connected to the second light-emitting module;

a frame unit including an inner surrounding gel frame, an outer surrounding gel frame and a second surrounding gel frame, wherein the inner surrounding gel frame is surroundingly disposed on the circuit substrate by coating and around the first light-emitting module to form an inner gel position limiting space, the outer surrounding gel frame is surroundingly disposed on the circuit substrate by coating and around the second light-emitting module and the inner surrounding gel frame to form an outer gel position limiting space between the inner surrounding gel frame and the outer surrounding gel frame, the second surrounding gel frame is surroundingly disposed on the circuit substrate by coating and around the first current-limiting module and the second current-limiting module to form a second gel position limiting space; and a package unit including an inner package gel body, an outer package gel body and a second package gel body, wherein the inner package gel body is received in the inner gel position limiting space to enclose the first light-emitting module, the outer package gel body is received in the outer gel position limiting space to enclose the second light-emitting module, and the second package gel body is received in the second gel position limiting space to enclose the first current-limiting module and the second current-limiting module.

10. The multichip package structure of claim 9, wherein the first inner conductive pads are arranged on the circuit substrate along a lateral side of the inner mirror plane area, the second inner conductive pads are arranged on the circuit substrate along another lateral side of the inner mirror plane area, and the circuit substrate includes a plurality of first inner standby pads respectively adjacent to the first inner conductive pads and a plurality of second inner standby pads respectively adjacent to the second inner conductive pads, wherein the first outer conductive pads are arranged on the circuit substrate along a lateral side of the outer mirror plane area, the second outer conductive pads are arranged on the circuit substrate along another lateral side of the outer mirror plane area, and the circuit substrate includes a plurality of first outer standby pads respectively adjacent to the first outer conductive pads and a plurality of second outer standby pads respectively adjacent to the second outer conductive pads.

11. The multichip package structure of claim 10, wherein the circuit substrate includes a plurality of third conductive pads corresponding to the first current-limiting chips and the second current-limiting chips and a plurality of fourth conductive pads corresponding to the first current-limiting chips and the second current-limiting chips, and each first current-limiting chip is electrically connected between the corresponding third conductive pad and the corresponding fourth conductive pad, and each second current-limiting chip is electrically connected between the corresponding third conductive pad and the corresponding fourth conductive pad, wherein the first current-limiting chips are electrically connected with each other in series, the second current-limiting chips are electrically connected with each other in series, and the circuit substrate includes a plurality of third standby pads respectively adjacent to the third conductive pads and a plurality of fourth standby pads respectively connected to the fourth conductive pads.

12. The multichip package structure of claim 9, wherein the inner surrounding gel frame is extended from an inner initial point to an inner terminal point, and the position of the inner initial point and the position of the inner terminal point are substantially the same, thus two end portions of the inner surrounding gel frame are substantially overlapping to form an inner convex junction portion on the top side of the inner surrounding gel frame, wherein the outer surrounding gel frame is extended from an outer initial point to an outer terminal point, and the position of the outer initial point and the position of the outer terminal point are substantially the same, thus two end portions of the outer surrounding gel frame are substantially overlapping to form an outer convex junction portion on the top side of the outer surrounding gel frame, wherein the second surrounding gel frame is extended from a second initial point to a second terminal point, and the position of the second initial point and the position of the second terminal point are substantially the same, thus two end portions of the second surrounding gel frame are substantially overlapping to form a second convex junction portion on the top side of the second surrounding gel frame.

13. The multichip package structure of claim 9, further comprising: a bridge rectifier disposed on the circuit substrate and electrically connected among the first current-limiting module, the second current-limiting module and an alternating current power source.

* * * * *

UNITED STATES PATENT AND TRADEMARK OFFICE
CERTIFICATE OF CORRECTION

PATENT NO. : 9,018,662 B2  Page 1 of 1
APPLICATION NO. : 14/076489
DATED : April 28, 2015
INVENTOR(S) : Chung et al.

It is certified that error appears in the above-identified patent and that said Letters Patent is hereby corrected as shown below:

On the title page item (73) should read: PARAGON SEMICONDUCTOR LIGHTING TECHNOLOGY CO., LTD., NEW TAIPEI CITY (TW)

Signed and Sealed this
Ninth Day of February, 2016

Michelle K. Lee
*Director of the United States Patent and Trademark Office*